(12) United States Patent
Eleftheriadis et al.

(10) Patent No.: US 12,588,141 B2
(45) Date of Patent: Mar. 24, 2026

(54) CIRCUIT BOARD ARRANGEMENT COMPRISING A CIRCUIT BOARD PROVIDED WITH A GRAPHENE ISLAND AND METHOD OF COMMUNICATING BETWEEN A FIRST AND A SECOND CIRCUIT

(71) Applicant: Telefonaktiebolaget LM Ericsson (publ), Stockholm (SE)

(72) Inventors: Lackis Eleftheriadis, Valbo (SE);
Anders Pettersson, Stockholm (SE)

(73) Assignee: TELEFONAKTIEBOLAGET ERICSSON LM (PUBL), Stockholm (SE)

( * ) Notice: Subject to any disclaimer, the term of this patent is extended or adjusted under 35 U.S.C. 154(b) by 309 days.

(21) Appl. No.: 18/033,444

(22) PCT Filed: Oct. 26, 2020

(86) PCT No.: PCT/SE2020/051034
§ 371 (c)(1),
(2) Date: Apr. 24, 2023

(87) PCT Pub. No.: WO2022/093083
PCT Pub. Date: May 5, 2022

(65) Prior Publication Data
US 2023/0389176 A1 Nov. 30, 2023

(51) Int. Cl.
*H05K 1/03* (2006.01)
*H05K 1/02* (2006.01)

(52) U.S. Cl.
CPC ......... *H05K 1/0306* (2013.01); *H05K 1/0298* (2013.01); *H05K 2201/0323* (2013.01); *H05K 2201/10098* (2013.01)

(58) Field of Classification Search
CPC .. H05K 1/0306; H05K 1/0298; H05K 1/0293; H05K 3/4069; H05K 1/11; H05K 3/40
See application file for complete search history.

(56) References Cited

U.S. PATENT DOCUMENTS 8,816,706 B1 * 8/2014 Ward ................... H05K 1/0275
324/693
9,174,413 B2 11/2015 Avouris et al.
(Continued)

FOREIGN PATENT DOCUMENTS

CN 102130040 A 7/2011

OTHER PUBLICATIONS

Extended European Search Report, European Patent Application No. 20960068.3, mailed Sep. 3, 2024, 10 pages.
(Continued)

*Primary Examiner* — Timothy J Thompson
*Assistant Examiner* — Aditya Sharma
(74) *Attorney, Agent, or Firm* — Sage Patent Group

(57) ABSTRACT

A circuit board arrangement includes a circuit board having two conductive material structures and a separating layer, where the structures are placed on opposite sides of the layer and the layer comprises a first graphene island stretching between a first area of a first of the structures and a second area of a second of the structures, which first graphene island is controllable to electrically interconnect the two areas or separate the two areas from each other. A method of communicating between a first and a second circuit via the structures comprises includes controlling the first graphene island to electrically interconnect the first and the second area and the first circuit communicating with the second circuit after the interconnection.

14 Claims, 4 Drawing Sheets

(56) References Cited

U.S. PATENT DOCUMENTS

| | | | |
|---|---|---|---|
| 9,332,632 B2 * | 5/2016 | Schneider | H05K 1/0207 |
| 2011/0101528 A1 | 5/2011 | Akimoto et al. | |
| 2011/0101529 A1 | 5/2011 | Akimoto et al. | |
| 2016/0057854 A1 | 2/2016 | Schneider et al. | |
| 2016/0225890 A1 * | 8/2016 | Datta | H10N 50/10 |
| 2016/0249450 A1 | 8/2016 | Min et al. | |
| 2017/0111087 A1 * | 4/2017 | Williamson | H04B 5/79 |
| 2018/0310414 A1 | 10/2018 | Yeh et al. | |
| 2018/0366400 A1 * | 12/2018 | Mohn | H01L 25/072 |
| 2019/0116663 A1 | 4/2019 | Findley | |
| 2019/0199196 A1 * | 6/2019 | Giombanco | H02M 3/33515 |

OTHER PUBLICATIONS

Mustafa, M., et al., "Electrospray Deposition of a Graphene-Oxide Thin Film, Its Characterization and Investigation of Its Resistive Switching Performance," Journal of the Korean Physical Society, vol. 61, No. 3, Aug. 2012, pp. 470-475, (XP055529923) 6 pages.

Núñez, C., et al., "Performance Analysis of Hybrid Metal-Graphene Frequency Reconfigurable Antennas In The Microwave Regime," IEEE Transactions Antennas and Propagation, vol. 65, No. 4, Apr. 2017, pp. 1558-1569, (XP011644878) 12 pages.

International Search Report and Written Opinion of the International Searching Authority, PCT/SE2020/051034, mailed Apr. 30, 2021, 10 pages.

Kumar, Vobulapuram Ramesh et al., "Graphene-Based On-Chip Interconnects and TSVs," IEEE Nanotechnology Magazine, Dec. 2014, 7 pages.

Zhu, Ye et al, "Growth and Fabrication of Carbon-Based Three-Dimensional Heterostructures in Through-Silicon Vias (TSVs) for 3D Interconnects," 2-17 IEEE 19th Electronics Packaging Technology Conference (EPTC), 2017, 5 pages.

* cited by examiner

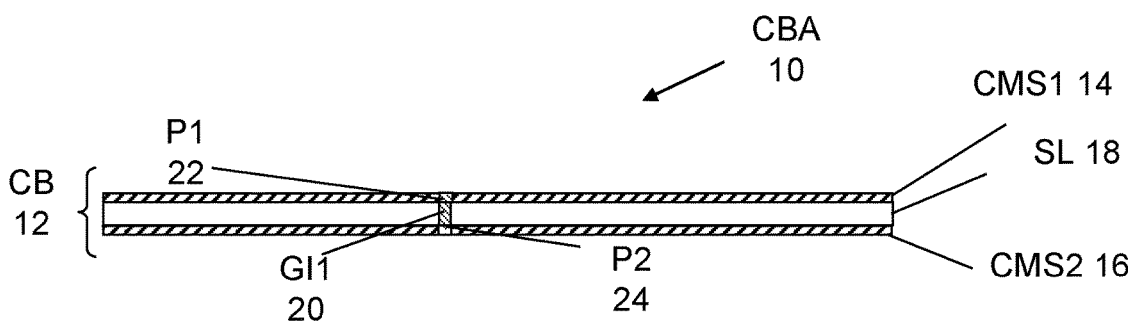
Fig. 3
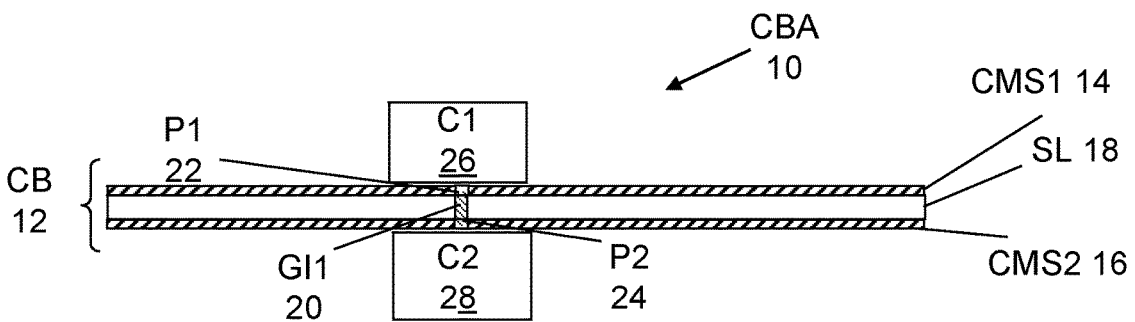
Fig. 4
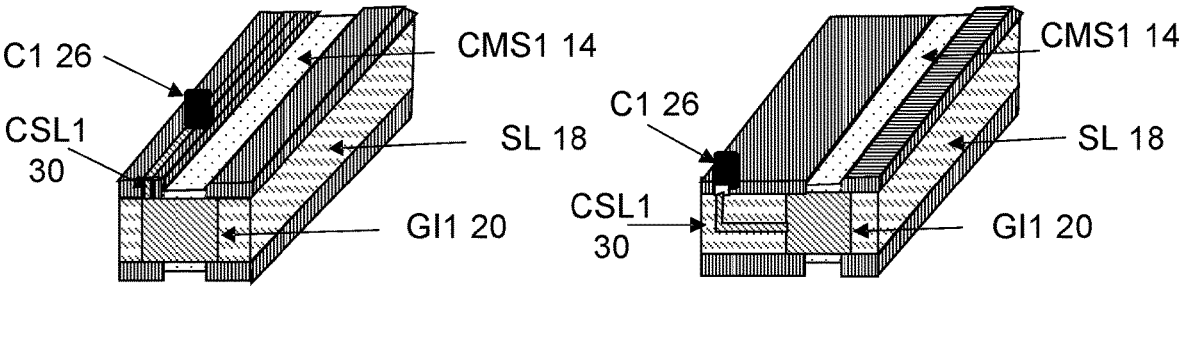
Fig. 5a                                                     Fig. 5b Control GI1 to electrically interconnect P1 and P2 — 46

Send data to C2 after electrical interconnection — 48

Control GI2 to electrically interconnect P3 and P4 — 50

Send data to C1 after electrical interconnection — 52

Control GI1 to separate P1 from P2 — 54

Control GI2 to separate P3 from P4 — 56

WCD
58

CN
60

C1
26

CCM
62

CIRCUIT BOARD ARRANGEMENT COMPRISING A CIRCUIT BOARD PROVIDED WITH A GRAPHENE ISLAND AND METHOD OF COMMUNICATING BETWEEN A FIRST AND A SECOND CIRCUIT

CROSS REFERENCE TO RELATED APPLICATIONS

This application is a 35 U.S.C. § 371 national stage application of PCT International Application No. PCT/SE2020/051034 filed on Oct. 26, 2020, the disclosure and content of which is incorporated by reference herein in its entirety.

TECHNICAL FIELD

The teachings of this disclosure relate to circuit boards. More particularly, the teachings relate to a circuit board arrangement comprising a circuit board and a method of communicating between a first and a second circuit via a first and a second conductive material structure of the circuit board.

BACKGROUND

Many circuit boards are today becoming smaller as well as more complex. A circuit board may as an example comprise a number of different layers, conductive material structures on and between the layers as well as orthogonal conductors that interconnect the conductive material structures. Thereby the conductive material structures may be separated by such layers and the layers can because of this also be termed separating layers. Moreover, an interconnecting orthogonal conductor that runs through and is perpendicular to different layers of the circuit board is often termed a via.

FIG. 1 shows perspective view of an example of one circuit board CB that comprises conductive material structures separated by separating layers and interconnected using vias. The circuit board may in this case be the circuit board of an Antenna Integrated Radio (AIR) unit that has many power and signal paths/routs on and between its different layers.

In the example in FIG. 1, there is a top layer comprising a first conductive material structure CMS1, which structure may comprise a number of conductor traces and contact pads. Below the top layer there is a first separating layer SL1, which in this case is a first core layer that may be formed through glass-reinforced epoxy laminate sheets. The first conductive material structure CMS1 is thus provided on a first side of the first separating layer SL1 and on a second side of the first separating layer SL1 there is a first internal plane IP1, which may be conductive material in a plane held at a certain electric potential, which as an example may be ground potential. Below the first internal plane IP1 there is a second separating layer SL2 that may be a first prepreg layer or insulating layer of for instance glass fiber. The first internal plane IP1 is thereby provided on a first side of the second separating layer SL2. A second side of the second separating layer SL2 is in this example provided with a second conductive material structure CMS2, which may be a first midlayer with contact pads and conductor traces. These contact pads and conductor traces of the second conductive material structure CMS2 are also provided on a first side of a third separating layer SL3. Also, the third separating layer SL3 may be a core layer. On a second side of the third separating layer SL3 there is a third conductive material structure CMS3 with contact pads and conductor traces. This third conductive material structure CMS3, which may be a second midlayer, is also placed on a first side of a fourth separating layer SL4, which in this case may be a second insulating layer in the form of a second Prepreg layer. On a second side of the fourth separating layer SL4 there is provided a second internal plane IP2, which may be a plane connected to a second electric potential such as a power supply or biasing potential like 3.5 or 1.2 V. This second internal plane IP2 is also provided on a first side of a fifth separating layer SL5. The fifth separating layer SL5 may in this case be a third core layer. A second side of the fifth separating layer SL5 comprises a fourth conductive material structure CMS4 with connection pads and conductor traces. The fourth conductive material structure CMS4 forms a bottom layer of the circuit board CB.

Here it can also be mentioned that the first and second internal planes IP1 and IP2 could be formed as layers of conductive material. The whole plane of such a layer, expect for some islands of insulation, may then be made of conductive material. Therefore, the first and second internal planes IP1 and IP2 may also be considered to be conductive material structures.

In FIG. 1 there are also two conductor paths V1$a$ and V1$b$ that run through the circuit board CB orthogonal to the separating layers SL1, SL2, SL3, SL4 and SL5, internal planes IP1 and IP2 and conductive material structures CMS1, CMS2, CMS3 and CMS4. These conductor paths V1$a$ and V1$b$ interconnect the first and the fourth conductive material structures CMS1 and CMS4. One conductor path V1$a$ is in this case connected to the first internal plane IP1 and passes through an island of insulation in the second internal plane IP2, while the other conductor path V1$b$ is connected to the second internal plane IP2 and passes through an island of insulation in the first internal plane IP1. Thereby any component connected to pads or traces linked to the conductor path V1$a$ may be grounded while any component connected to pads or traces linked to conductor path V1$b$ may be connected to a power supply or biasing potential. The conductor paths V1$a$ and Vb run between the top and bottom layers of the whole circuit board CB s. The conductor paths V1$a$ and V1$b$ are thereby examples of so-called drilled or through hole vias.

FIG. 2 schematically shows another circuit board, where again there is a first conductive material structure CMS1 and a second conductive material structure CMS2 on opposite sides of a first separating layer SL1, where the first conductive material structure CMS1 forms a top layer of the circuit board. There is also a second separating layer SL2, where the second conductive material structure CMS2 is provided on a first side of the second separating layer SL2 and a third conductive material structure CMS3 is provided on a second side of the second separating layer SL2. The third conductive material structure CMS3 is also provided on a first side of a third separating layer SL3, the second side of which is provided with a fourth conductive material structure CMS4. The fourth conductive material structure CMS4 is also placed on a first side of a fourth separating layer SL4, while a fifth conductive material structure CMS5 is provided on a second side of the fourth separating layer SL4. The fifth conductive material structure CMS5 is provided on a first side of a fifth separating layer SL5 and a sixth conductive material structure CMS6 is provided on a second side of the fifth separating layer SL5, where the sixth conductive material structure CMS6 forms a bottom layer of the circuit board.

The first, second, fourth and fifth separating layers SL1, SL2, SL4 and SL5 may in this case be insulating layers such as for instance pure polymer layers, while the third separating layer SL3 may be a core layer such as an FR4 core layer of glass-reinforced epoxy laminate sheets.

As can be seen in FIG. 2 there are a number of orthogonal vias connected between the conductive material structures. There is a first via V1 connected between a conductor trace or pad in the first conductive material structure CMS1 and a conductor trace or pad in the sixth conductive material structure CMS6. As can be seen the first via V1 is also connected to a conductor trace or pad in the third conductive material structure CMS3 and a conductor trace or pad in the fifth conductive material structure CMS5. The first via V1 passes through all the separating layers SL1, SL2, SL3, SL4 and SL5. There is also a second via V2 connected between a conductor trace or pad in the first conductive material structure CMS1 and a conductor trace or pad in the second conductive material structure CMS2. Thereby the second via V2 only passes through the first separating layer SL1. The second via V2 is also placed at the surface formed by the top layer of the circuit board. There is also a third via V3 running between the same conductor trace or pad in the second conductive material structure CMS2 and a conductor trace or pad in the third conductive material structure CMS3. A fourth via V4 runs between the same conductor trace or pad in the second conductive material structure CMS2 and a different conductor trace or pad in the third conductive material structure CMS3. It can thereby be seen that the third and fourth vias V3 and V4 are both only separated by the second separating layers SL2 and SL3. They are also placed beneath the circuit board surface provided by the first conductive material structure CMS1. A fifth via V5 runs between a conductor trace or pad in the third conductive material structure CMS3 and a conductor trace or pad in the fourth conductive material structure CMS4. Thereby the fifth via only passes through the third separating layer SL3. It is also placed in the interior of the circuit board. A sixth via V6 is connected between a conductor trace or pad in the first conductive material structure CMS1 and a conductor trace or pad in the second conductive material structure CMS2. Thereby the sixth via V6 only passes through the first separating layer SL1. The sixth via V6 is also placed at the surface of the circuit board.

A seventh via V7 interconnects a conductor trace or pad in the sixth conductive material structure CMS6 with a conductor trace or pad in the fifth conductive material structure CMS5, an eighth via V8 interconnects a conductor trace or pad in the fourth conductive material structure CMS4 with a conductor trace or pad in the fifth conductive material structure CMS5, where the conductor trace or pad in the fourth conductive material structure CMS4 is the same pad or conductor trace to which the fifth via V5 is connected. Finally, a ninth via V9 interconnects the same conductor trace or pad in the fifth conductive material structure CMS5 with a conductor trace or pad in the sixth conductive material structure CMS6. Furthermore, the sixth material structure CMS6 forms the bottom layer of the circuit board.

It can thus be observed that the seventh and the ninth vias V7 and V9 only pass through the fifth separating layer SL5. They are also placed at the surface formed by the bottom layer of the circuit board. The eighth via V8 only passes through the fourth separating layer SL4. It is also placed beneath the circuit board surface provided by the sixth conductive material structure CMS6.

The first via V1 is an example of a so-called through hole or drilled via going through the entirety of the circuit board, i.e. from the top to the bottom layer of the circuit board. The second, sixth, seventh and ninth vias V2, V6, V7 and V9 are examples of blind vias, i.e. visible vias that can be accessed on the surface of the circuit board CB and that only pass through parts of the circuit board, such as one or two layers, but not between the top and the bottom layers of the circuit board. The third, fourth, fifth and eighth vias V3, V4, V5 and V8 are examples of buried vias, i.e. vias that are provided in the interior of the circuit board and thus not visible or accessible from its surfaces.

The provision of a via may involve drilling and therefore the vias are typically large. If copper is used for a via it may as an example have a wire size in the range 34-103 μm. Thereby the circuit board may become unnecessarily bulky. Furthermore, vias and the conductor elements of the circuit board that they are connected to in essence form antennas, which can pick up noise or interference. This may disturb the operation of circuits being provided in or on the circuit board.

Furthermore, the manufacturing of the circuit board using through hole vias, blind vias, or buried vias in several layers inside the circuit board is often complex.

It is for instance typically necessary to add one more extra procedure for making such vias, and if the vias are not manufactured well, they can create a faulty condition.

There is thus a need for an improvement of the circuit board, especially with regard to bulkiness and/or noise or interference.

SUMMARY

The solution of this disclosure is directed towards improving a circuit board with regard to one or more of the above-mentioned issues.

This object is according to a first aspect achieved through a circuit board arrangement that comprises a circuit board. The circuit board in turn comprises at least two conductive material structures and a separating layer, where the two conductive material structures are placed on opposite sides of the separating layer. The separating layer comprises a first graphene island that stretches between a first area of a first of the conductive material structures and a second area of a second of the conductive material structures and the first graphene island is controllable to electrically interconnect the two areas or separate the two areas from each other.

The object is according to a second aspect also achieved by a wireless communication device comprising the circuit board arrangement according to the first aspect.

The first graphene island may be a controllable via running through the separating layer, where the controllable via may be a through hole via, a blind via or a buried via.

Furthermore, the circuit board arrangement may comprise a first circuit connected to the first area and a second circuit connected to the second area. In this case the first circuit may be configured to control the first graphene island to electrically interconnect the first and the second area and to communicate with the second circuit after the electrical interconnection.

The object of improving a circuit board is according to a third aspect achieved through a method of communicating between a first and a second circuit via a first and a second conductive material structure of a circuit board, where the two conductive material structures are placed on opposite sides of a separating layer of the circuit board and the separating layer comprises a first graphene island that stretches between a first area of a first of the conductive material structures and a second area of a second of the conductive material structures, where the first graphene island is controllable to electrically interconnect the two areas or separate the two areas from each other. The method comprises:

controlling the first graphene island to electrically inter-
    connect the first and the second area, and
  the first circuit communicating with the second circuit
    after the electrical interconnection.

According to a variation of the first aspect, the first circuit is further configured to control the first graphene island to separate the first area from the second area after the communication.

According to a corresponding variation of the third aspect, the method further comprises controlling the first graphene island to separate the first area from the second area after the communication.

The circuit board arrangement may additionally comprise a first switch configured to selectively connect the first graphene island to an electric potential in order to electrically interconnect the first and the second area. In this case the first switch may additionally be connected to the electric potential via a first impedance for regulating a degree of electrical interconnection between the first and the second area.

Therefore the first circuit when controlling the first graphene island to electrically interconnect the first and the second area may be configured to control the first switch to connect to the electric potential and when controlling the first graphene island to separate the first area from the second area after the communication may be configured to control the first switch to disconnect from the electric potential.

In the method, the controlling of the first graphene island to electrically interconnect the first and the second area may in a corresponding way comprise controlling the first switch to connect to the electric potential and the controlling of the first graphene island to separate the first area from the second area after the communication may comprise controlling the first switch to disconnect from the electric potential.

The communication may in the above described cases comprise obtaining sensor measurements from the second circuit. Alternatively, the communication may comprise sending data to the second circuit.

The electric potential to which the first graphene island gets connected may be ground potential, the first circuit may keep the first area at an operating potential of the first circuit, while the second circuit may optionally keep the second area at an operating potential of the second circuit.

In order to accomplish the activities described above. the first circuit may comprise a communication control module, which communication control module is configured to control the first graphene island to electrically interconnect the first and the second area, to communicate with the second circuit after the electrical interconnection and to control the first graphene island to separate the first area from the second area after the communication.

It is additionally possible that the circuit board arrangement comprises a second graphene island in the separating layer, which second graphene island stretches between a third area in the first conductive material structure and a fourth area in the second conductive material structure, where the second graphene island is controllable to electrically interconnect the two areas or separate the two areas from each other.

In this case the first circuit may also be connected to the third area and the second circuit may also be connected to the fourth area. The first circuit, when communicating with the second circuit after the electrical interconnection, may in this case be configured to send data to the second circuit. The second circuit may also be configured to control the second graphene island to electrically interconnect the third and the fourth area as well as to communicate with the first circuit after the electrical interconnection.

In the method, the first circuit communicating with the second circuit after the electrical interconnection may in this case comprise the first circuit sending data to the second circuit. The method may additionally comprise controlling the second graphene island to electrically interconnect the third and the fourth area and the second circuit sending data to the first circuit after this electrical interconnection.

In the circuit board arrangement, the second circuit may additionally be configured to control the second graphene island to separate the third area from the fourth area after the sending of data from the second circuit to the first circuit.

In a corresponding manner the method may additionally comprise controlling the second graphene island to separate the third area from the fourth area after the sending of data from the second circuit to the first circuit.

The circuit board arrangement may additionally comprise a second switch configured to selectively connect the second graphene island to an electric potential in order to electrically interconnect the third and the fourth area. In this case the second switch may additionally be connected to the electric potential via a second impedance for regulating a degree of electrical interconnection between the third and the fourth area.

Through the presence of the second switch, he second circuit when controlling the second graphene island to electrically interconnect the third and the fourth area, may be configured to control the second switch to connect to the electric potential and when controlling the second graphene island to separate the third area from the fourth area after the sending of data, may be configured to control the second switch to disconnect from the electric potential.

In the method, the controlling of the second graphene island to electrically interconnect the third and the fourth area may in a corresponding way comprise controlling the second switch to connect to the electric potential and the controlling of the second graphene island to separate the third area from the fourth area after the sending of data may comprise controlling the second switch to disconnect from the electric potential.

The electric potential to which the second graphene island is connected may be ground potential, the first circuit may keep the third area at an operating potential of the first circuit, while the second circuit may keep the fourth area at an operating potential of the second circuit.

The second circuit may in a similar manner to the first circuit comprise a communication control module, which communication control module is configured to control the second graphene island to electrically interconnect the third and the fourth area, to send data to the first circuit after the electrical interconnection and to control the second graphene island to separate the third area from the fourth area after the sending of data.

It should be emphasized that the term "comprises/comprising" when used in this specification is taken to specify the presence of stated features, integers, steps or components, but does not preclude the presence or addition of one or more other features, integers, steps, components or groups thereof.

BRIEF DESCRIPTION OF THE DRAWINGS

The solution of this disclosure will now be described in more detail in relation to the enclosed drawings, in which:

FIG. 5a shows a first realization of a connection of the first circuit to the first graphene island, FIG. 5b shows a second realization of a connection of the first circuit to the first graphene island, FIG. 6 schematically shows a part of the circuit board arrangement from FIG. 4 together with a first switch and a first resistance.

DETAILED DESCRIPTION

In the following description, for purposes of explanation and not limitation, specific details are set forth such as particular architectures, interfaces, techniques, etc. in order to provide a thorough understanding of the solution of this disclosure. However, it will be apparent to those skilled in the art that the solution of this disclosure may be practiced in other variants that depart from these specific details. In other instances, detailed descriptions of well-known devices, circuits, and methods are omitted so as not to obscure the description of the solution of this disclosure with unnecessary detail.

Aspects of the present solution of this disclosure are concerned with limiting the size of and/or noise or interference in a circuit board.

Figure 1:
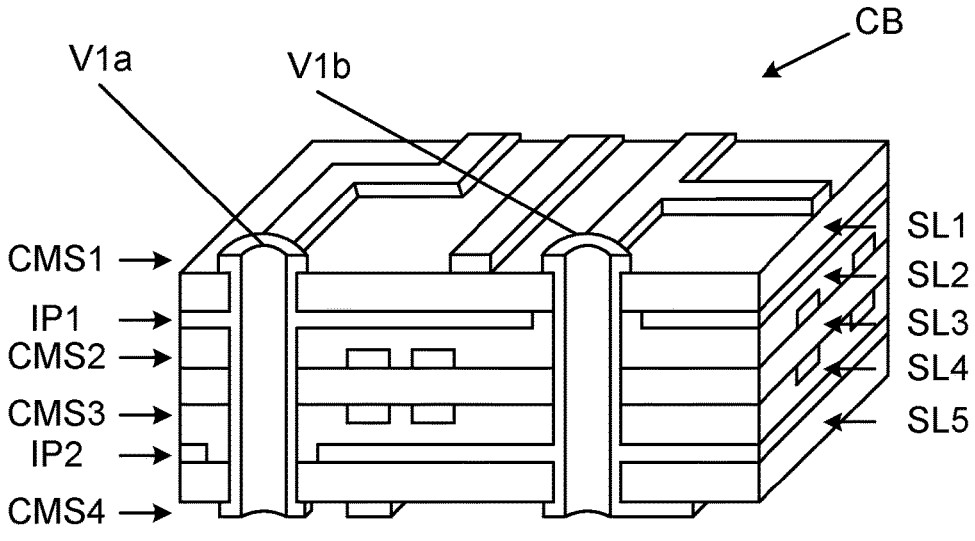
FIG. 1 schematically shows a perspective view of a first known layered circuit board with vias running between a first conductive material structure and a fourth conductive material structure, FIG. 2 schematically shows a side view of a second known circuit board with different types of vias running through a number of separating layers of the circuit board, FIG. 3 schematically shows a circuit board arrangement comprising a circuit board having a first graphene island stretching between a first and a second area of a first and a second conductive material structure that are separated by a separating layer, FIG. 4 schematically shows a circuit board arrangement that comprises the circuit board of FIG. 3 as well as a first and a second circuit connected to the first and the second areas.
Figure 2:
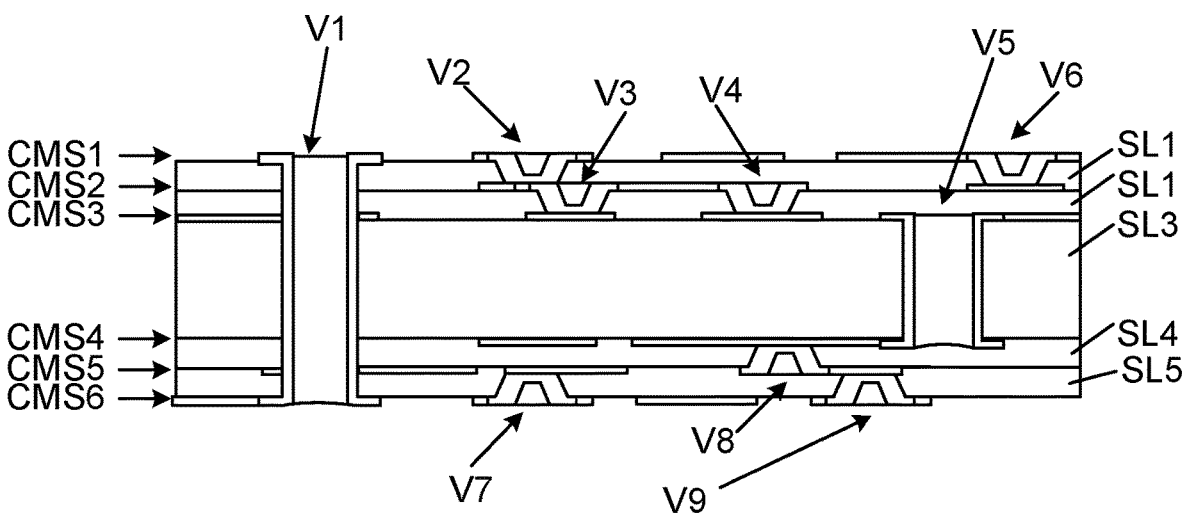

As has been discussed earlier layered circuit boards, such as the circuit boards in FIGS. 1 and 2 comprise vias that makes the circuit board bulkier as well as acts as antennas that introduce noise or interference, which noise or interference can affect the operation of circuits on or in the circuit board.

In order to address these problems aspects of the present disclosure are directed towards a circuit board arrangement comprising a circuit board where at least one via connected between two areas of two conductive material structures has been replaced by a graphene island that is controllable to electrically interconnect the two areas or separate the two areas from each other.

FIG. 3 schematically shows a circuit board arrangement CBA 10 according to a first aspect of the present disclosure, which circuit board arrangement 10 comprises a circuit board CB 12, often denoted a printed circuit board (PCB). Moreover, the circuit board 12 comprises at least two conductive material structures and at least one separating layer. There is a first conductive material structure CMS1 14 and a second conductive material structure CMS2 16. The first conductive material structure 14 may be provided in a first plane and the second conductive material structure 16 may be provided in a second plane. The first and second conductive material structures 14 and 16 are furthermore separated from each other by at least one separating layer SL 18.

Each conductive material structure may be provided in its corresponding plane as a pattern of conductor traces, such as conductors, and pads, such as contact pads, of conductive material like for instance copper, aluminium or gold.

The separating layer 18 may be an insulating layer, such as prepreg, polymer or core layer. In this way the two conductive material structures 14 and 16 are placed on opposite sides of the separating layer 18.

More particularly, the separating layer 18 comprises a first graphene island GI1 20 that stretches between a first area 22 of the first conductive material structure 14 and a second area 24 of the second conductive material structure 16. The circuit board 12 thereby comprises a string of graphene that interconnects the first and the second areas 22 and 24. In the present example the first area 22 is a first pad P1 and the second area 24 is a second pad P2. However, it should be realized that that such an area need not necessarily be a pad but can be realized as any part of the conductive material structure. The string of graphene may additionally have an orientation that is perpendicular to the planes of the conductive material structures 14 and 16 and the separating layer 18. The string of graphene is also typically surrounded by insulating material of the separating layer 18.

Graphene is a material that normally acts as an insulator. However, it can be made conducting if a voltage is applied to it. The first graphene island is thereby controllable to electrically interconnect the two areas or separate the two areas from each other. Because of this the first graphene island 20 may also be considered to be a controllable via that runs through the separating layer 18, for instance running orthogonal to the separating layer and the first and second planes in which the first and second conductive material structures are provided.

As can be understood from FIGS. 1 and 2, it is possible with more separating layers between the first and second conductive material structures of the circuit board arrangement in FIG. 3. It is also possible that there are one or more further conductive material structures between the first and second conductive material structures 14 and 16. It is furthermore possible that there is one or more internal planes between the first and second conductive material structures 14 and 16, which internal planes provide grounding and/or power supply potentials, where as was mentioned earlier, the internal planes can also be seen as conductive material structures.

As yet another alternative, it is possible with further layers, such as insulating layers, and/or further conductive material structures above the first conductive material structure 14 as well as further layers, such as insulating layers, and/or further conductive material structures below the second conductive material structure 16.

It should thereby be realized that a graphene island may form a controllable via that is of any of the types shown in FIG. 2. A graphene island may thus be a controllable through hole via, a controllable blind via or a controllable buried via. The graphene may be applied as a thin graphene line, for instance using graphene ink during 3D printing of the circuit board. The graphene island may therefore be considerably thinner than a line made of a corresponding metal wire, which allows the circuit board size to be reduced.

FIG. 4 shows a circuit board arrangement 10 according to a second aspect of the present disclosure. The circuit board arrangement 10 according to this aspect comprises a circuit board 12 that may have the same realization as the circuit board of the first aspect.

In this second aspect there is a first circuit C1 26 connected to the first area 22 or pad P1 of the first conductive material structure 14 and a second circuit C2 28 connected to the second area 24 or pad P2 of the second conductive material structure 16. The first circuit 26 may be an integrated circuit, for instance realised as a component that is connected to the first pad P1, such as through soldering. In a similar manner the second circuit 28 may also be an integrated circuit, for instance realised as a component that is connected to the second pad P2, such as through soldering.

FIG. 5a shows a perspective view of a part of the circuit board with the first circuit 26 having a first type of connection to the first graphene island 20. In this case the first pad (not shown) with the first circuit C1 is connected to a first control signal line CSL1 30 provided above the separating layer SL 18. The first pad is more particularly placed in insulation surrounding the first conductive material structure 14. The first control signal line 30 in the first plane is connected to the first graphene island 20 below it. The first control signal line 30 may run from the first circuit 26 to an edge of the circuit board beside part of the first conductive material structure 14, such as in parallel with said part of the first material structure 14 as well as run above and be joined to an edge of the first graphene island 20 below it. The first control signal line 30 may thus be provided in an external path to the first circuit 26. The first control signal line 30 is with advantage also realised through the use of graphene. However, a conductive material such as copper, aluminium or even gold is also feasible.

FIG. 5b shows a perspective view of a part circuit board with the first circuit 26 having a second type of connection of the first circuit 26 to the first graphene island 20. In this case the first pad with the first circuit 26 is connected to a first control signal line CSL 30 provided in insulation in the separating layer SL 18 surrounding the first graphene island 20, which first control signal line 30 is likewise connected to the first graphene island 20. The first control signal line is thus integrated within the insulating material of the separating layer 18 from the first graphene island 20 towards the path to the first circuit 26. The first control signal line 30 is also here with advantage realised through the use of graphene. However, a conductive material such as copper, aluminium or even gold is also feasible.

Figure 6:
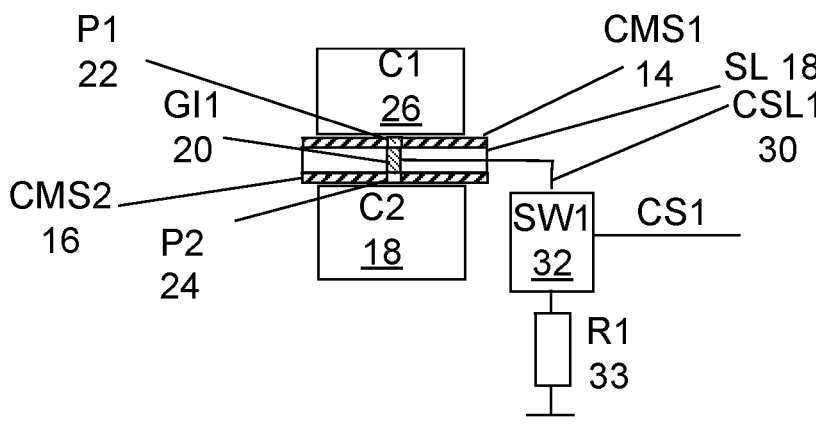

FIG. 6 schematically shows part of a circuit board 12 with the first and second circuits 26 and 28 in a circuit board arrangement according to a third aspect of the present disclosure, where the first and second circuits 26 and 28 are connected to the first graphene island 20 in the same way as in FIG. 4. In this case the first control signal line 30 is connected between the first graphene island 20 and a first end of a first switch SW1 32, the second end of which is connect to an electric potential via an optional first resistance R1 33, which electric potential in this case is a ground potential. The first switch 32 and optionally also the first resistance 33 may be a part of the first circuit 26 or as shown in this figure, they may be provided as separate components. The first switch 32 is provided for selectively connecting the first graphene island 20 to ground in order to electrically interconnect the first and the second pads P1 and P2. The grounding may be obtained by a connection to a grounding potential, which may be obtained via a grounding internal plane of the circuit board 12. At least the first circuit 26 may additionally provide a certain operating voltage for the first pad P1. The first circuit 26 may thus keep the first area 22 at an operating potential of the first circuit 26. It is possible that the second circuit 28 provides the same or a similar operating voltage for the second pad P2. The second circuit 28 may thus keep the second area 24 at an operating potential of the second circuit 28. Furthermore, both the operating potentials may be higher than the potential to which the first switch 32 is connected. The first switch 32 may as an example be a metal oxide semiconductor field effect transistor (MOSFET) or a bipolar junction transistor (BJT).

Figure 7:
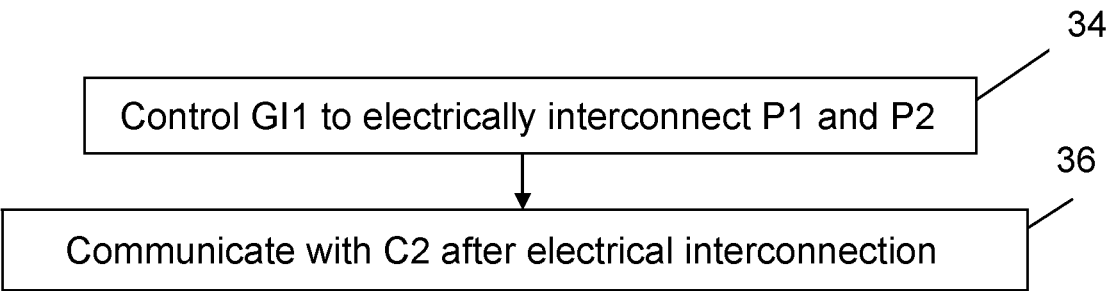
FIG. 7 shows a flow chart of a method of communicating between the first and the second circuits.

One way of operating the circuit board arrangement according to the third aspect will now be described with reference also being made to FIG. 7, which shows a flow chart of two method steps in a method of communicating between the first and the second circuit 26 and 28, which method steps are being carried out by the first circuit 26.

The first circuit 26 may be a circuit that sends data to the second circuit 28. It may also be a circuit that obtains information from the second circuit 28, which information may likewise comprise data from the second circuit 28. Alternatively, the information may comprise sensor measurements for instance analog sensor measurements, from the second circuit 28. In the latter case the second circuit 28 may be a passive circuit.

The method may start by the first circuit 26 needing to communicate with the second circuit 28, for instance if it has data to send or if it needs to collect or obtain sensor measurements.

In this case the first circuit 26 controls the first graphene island 20 to electrically interconnect the first and the second pad P1 and P2, step 34. This may be done through the first circuit 26 emitting a first control signal CS1 that closes the first switch 32, which in turn causes the first graphene island 20 to be connected to the electric potential, in this case ground, via the first control signal line 30. Because of the use of the operating voltage by the first circuit 26 and this grounding, the first graphene island 20 gets conductive and electrically interconnects the two pads P1 and P2. Thereafter, i.e. after the electrical interconnection, the first circuit 26 then communicates with the second circuit 28, step 36, which may involve sending data to the second circuit 28 or obtaining sensor measurements from the second circuit 28.

When the first circuit 26 is satisfied, through either having sent all the data that it intended to send or having obtained all the sensor measurements that it intended to obtain, it may then optionally control the first graphene island 20 to electrically separate the first pad P1 from the second pad P2. The separation may thus be carried out after the communication. The separation may be carried out in an analogous manner through sending a control signal that opens the first switch 32, i.e. through controlling the first switch 32 to disconnect from the electric potential. Alternatively, the channel may remain open through the first switch 32 remaining closed.

It can thereby be seen that the graphene material of the first graphene island is enabled via an integrated first control signal CS1 (transmitted in a first control signal line 30 that is integrated in the insulation of the separating layer) and this signal enables and disables communication via the first graphene island 20. The application of the first control signal CS1 is thus decided based on the need to transfer information from one conductive material structure to another, and it opens the path through the first graphene island 20 in advance, to allow the graphene material to "unblock" signals to pass thought it.

The idea is thus to apply the graphene material on isolated barriers of graphene islands and to enable control of the graphene material by making a variable current control of the islands and control the routing of information such as different clock signals when needed.

The signal path provided through a graphene island 20 can in this way be controlled from a separate control signal, enabling a passing of signal information, from e:g one circuit to another where the control signal is transmitted in advance to open this channel implemented through the graphene island between the conductive material structures.

In this way a dedicated graphene island is provided which can be connected for critical signalling, without interfering with the rest of the signalling on the circuit board.

The idea is thus to apply the graphene material on an isolated barrier and to enable control of the material by making a variable current control of the graphene islands and to let information such as different clock signals to pass when needed.

As was mentioned above both the first and the second circuit 26 and 28 may transmit data to the other.

Figure 8:
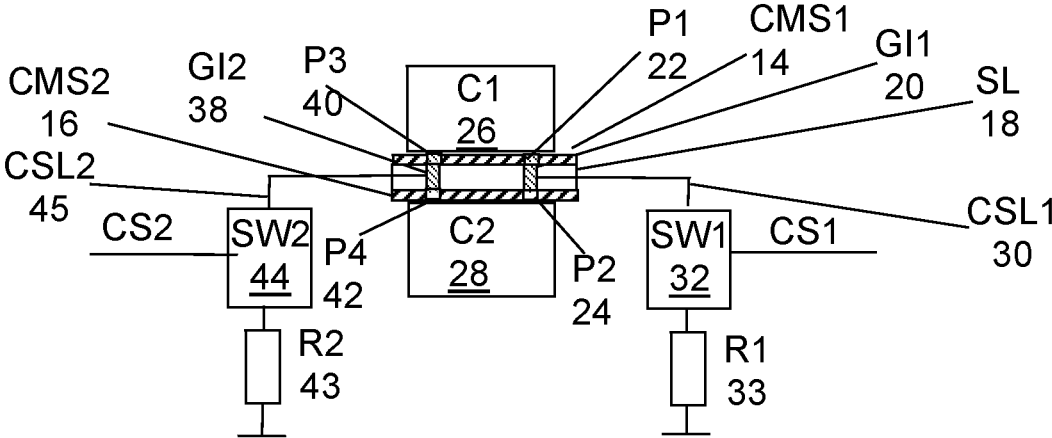
FIG. 8 shows a variation of the circuit board arrangement of FIG. 6 in which there is additionally a second switch and a second resistance as well as a second graphene island stretching between a third and a fourth area of the first and a second conductive material structure also interconnecting the first and the second circuit.

FIG. 8 schematically shows part a circuit board 12 with the first and second circuits 26 and 28 in a circuit board arrangement according to a fourth aspect of the present disclosure. The circuit board arrangement in this case comprises the elements of the third aspect shown in FIG. 6 that were related to the first graphene island 20. Furthermore, in this case the separating layer 18 also comprises a second graphene island GI2 38 that stretches between a third area 40 of the first conductive material structure 14 and a fourth area 42 of the second conductive material structure 16, where the third area 40 in this case may be realized as a third pad P3 and the fourth area 42 may be realized as a fourth pad P4. Naturally these areas are also not limited to pads. The second graphene island 38 may be realized in the same way as the first graphene island 20, i.e. as a string of graphene. The circuit board 12 thereby comprises a string of graphene that interconnects the third and the fourth pads P3 and P4. Furthermore, the first circuit 26 is connected to the third pad P3 and the second circuit 28 is connected to the fourth pad P4.

The control of the second graphene island 38 may with advantage be realized in the same way as the control of the first graphene island 20. Therefore, the second circuit 28 may be connected to the second graphene island 38 using a second control signal line CSL2 45, where second control signal line 45 may be realized according to one of the ways shown in FIGS. 5a and 5b. As can be seen in FIG. 8, there is therefore a second control signal line 45 connected between the second graphene island 38 and a first end of a second switch SW2 44, the second end of which is connected to an electric potential via an optional second resistanceR2 43, which electric potential also in this case is ground. The second switch 44 and optional second resistance 43 may likewise be a part of the second circuit 28 or as shown in this figure as separate components. The second switch 44 is provided for selectively connecting the second graphene island 38 to ground in order to electrically interconnect the third and the fourth pads P3 and P4. The grounding may also in this case be obtained by a connection to a grounding potential, which may be obtained via a grounding internal plane of the circuit board. In this case both the first and the second circuit 26 and 28 may provide a certain operating voltage on the first and second pads P1 and P2 and the third and fourth pads P3 and P4. The first circuit 26 may thus keep the third area 40 at an operating potential of the first circuit 26, while the second circuit 28 may keep the fourth area 42 at an operating potential of the second circuit 28. These operating potentials are also in this case higher than the potential to which the second switch 44 is connected.

One way of operating the circuit arrangement according to the fourth aspect will now be described with reference being made to FIG. 9, which shows a flow chart of method steps in a variation of the method of communicating between the first and the second circuit 26 and 28, where half the steps are being carried out by the first circuit 26 and half by the second circuit 28.

When the first circuit 26 needs to send data to the second circuit 28, it controls the first graphene island 20 to electrically interconnect the first and the second pads P1 and P2, step 46. This may be done through the first circuit 26 emitting a first control signal CS1 that closes the first switch 32, which in turn causes the first graphene island 20 to be connected to the electric potential, in this case ground, via the first control signal line 30. Because of the use of the operating voltage by the first and possible also by the second circuit and this grounding, the first graphene island 20 gets conductive and electrically interconnects the first and the second pads P1 and P2. Thereafter, i.e. after the electrical interconnection, the first circuit 26 sends data to the second circuit 28, step 48.

When the second circuit 28 needs to send data to the first circuit 26, it controls the second graphene island 38 to electrically interconnect the third and the fourth pad P3 and P4, step 50. This may be done through the second circuit 28 emitting a second control signal CS2 that closes the second switch 44, which in turn causes the second graphene island 38 to be grounded via the second control signal line 45. Because of the use of the operating voltage by the second and possibly also by the first circuit together with the grounding, the second graphene island 38 gets conductive and electrically interconnects the third and the fourth pads P3 and P4. Thereafter, i.e. after the electrical interconnection, the second circuit 28 sends data to the first circuit 26, step 52.

When the first circuit 26 is satisfied through having sent all the data that it intended to send, it may control the first graphene island 20 to electrically separate the first pad P1 from the second pad P2, step 54. The separation may thus be carried out after the communication. The separation may again be carried out through sending a control signal that opens the first switch 32.

When in turn the second circuit 28 is satisfied through having sent all the data that it intended to send, it may control the second graphene island 38 to electrically separate the third pad P3 from the fourth pad P4, step 56. The separation may thus also here be carried out after the communication. The separation may again be carried out through sending a control signal that opens the second switch 44, i.e. through controlling the second switch 44 to disconnect from the electric potential.

Thereby selective bidirectional communication is provided through the use of two controllable graphene islands.

It is of course possible to provide even more graphene islands. The graphene islands can then be set to control different task, or signal paths such as open/close channels, open/close data busses at different times or usage etc.

Through the use of a graphene island instead of a via, the size of the circuit board can be reduced. The use of graphene additionally allows a limitation of noise or interference caused by the use of vias. As a graphene island that acts as an insulator does not contribute to the forming of an antenna, it does not contribute to the forming of noise or interference.

The graphene island is easy to manufacture compared to drilling and insertion of metal wiring. The graphene island can be formed through 3D printing, basically because it uses graphene ink. The graphene material is also lighter than the metal conductor, for the same size. There is also an improvement in the transmission of signals, since the Graphene material can be used to "block" transmission between two conductive material structures. Also, the routing of signals between the conductive material structures can be improved.

As was mentioned earlier the use of the first and second resistances was optional. It is thus possible to omit the resistances. The first and second switches may therefore be directedly connected to ground. The use of a resistance can be advantageous if the amount with which a graphene island is opened needs to be controlled. For a fully open channel, the corresponding switch is directly grounded. However, if a channel is only to be partly opened, a resistance having a value corresponding the desired degree of opening is used. The first and second resistances are thus used for regulating a degree of electrical interconnection between the first and the second area and the third and fourth area, respectively. Furthermore, the first and second resistances are examples of first and second impedances that can be used, where other examples are capacitances and inductances.

Moreover, in the examples given above the first, second, third and fourth areas were placed at operating potentials of the first and second circuits, while the first and second switches were connected to ground. It is as an alternative possible that for instance the first and second and/or the third and fourth areas are grounded, while the corresponding switch is connected to a higher potential, such as 3.5 or 1.2 V.

The circuit board arrangement may be provided in a number of different devices and environments. As one example it may be provided as a part of a wireless communication device in a cellular network. FIG. 10 schematically outlines one such cellular network CN 60 comprising a wireless communication device WCD 58 including a circuit board arrangement. The wireless communication device is in this case a base station. At least the circuit board of the circuit board arrangement may then be provided as a circuit board of a radio unit or an Antenna Integrated Radio (AIR) unit.

The cellular network may as an example be a mobile communication system like a fifth Generation (5G) mobile communication system or a Long-Term Evolution (LTE) mobile communication system.

Figures 9, 10, 11:
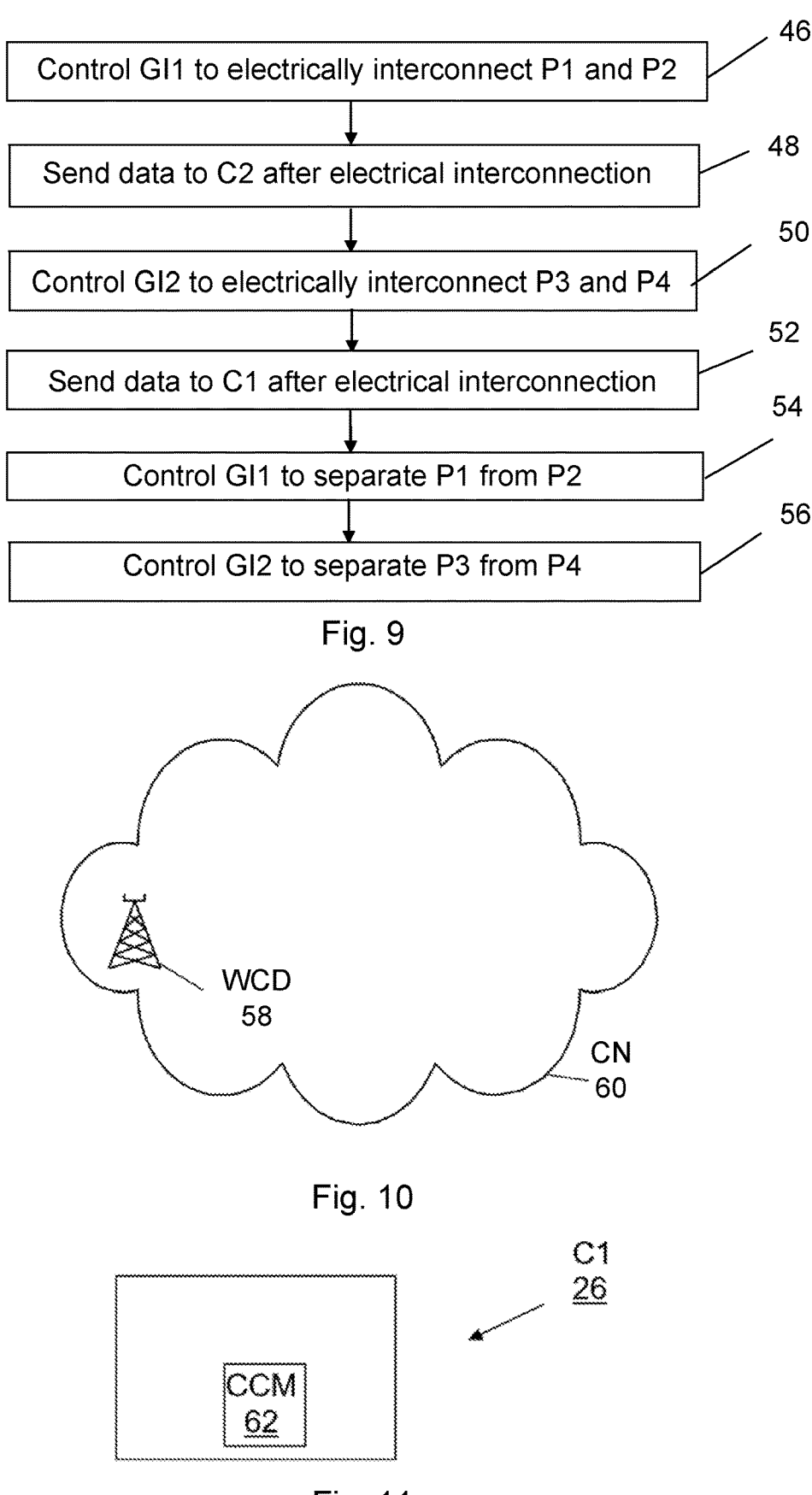
FIG. 9 shows a flow chart of a variation of the method of communicating between the first and the second circuits, FIG. 10 schematically shows one environment in which the circuit board arrangement may be provided, and FIG. 11 schematically shows the first circuit comprising a communication control module.

FIG. 11 schematically shows a block schematic of relevant parts of the first circuit 26. The first circuit 26 comprises a communication control module CCM 62, which communication control module 62 controls the first graphene island to electrically interconnect the first and the second area of the first and second conductive material structures, communicates with the second circuit after the electrical interconnection and optionally also controls the first graphene island to separate the first area from the second area after the communication. The first circuit may also comprise one or more units for performing some kind of processing. However, as this processing is not directly related to the aspects of the present solution of the disclosure described herein, such units have been omitted.

The communication control module may as an example be realized as a processor acting on computer instructions implementing the above-mentioned functionality—As another alternative it may be realized using discrete components.

It should be realized that the second circuit may comprise a communication control module that performs the same type of operation with regard to the second graphene island and the third and fourth area of the first and second conductive material structures. Therefore FIG. 11 can also be used for describing the second circuit.

The communication control module of the first circuit may be considered to comprise means for controlling the first graphene island to electrically interconnect the first and the second area, means for communicating with the second circuit after the electrical interconnection and means for controlling the first graphene island to separate the first area from the second area after the communication.

The means for controlling the first graphene island to electrically interconnect the first and the second area may comprise means for controlling the first switch to connect to an electric potential and the means for controlling the first graphene island to separate the first area from the second area after the communication may comprise means for controlling the first switch to disconnect from the electric potential. The means for communicating with the second circuit after the electrical interconnection may additionally comprise means for obtaining sensor measurements from the second circuit and/or means for sending data to the second circuit.

In a similar manner, the communication control module of the second circuit may be considered to comprise means for controlling the second graphene island to electrically interconnect the third and the fourth area, means for sending data to the first circuit after this electrical interconnection and means for controlling the second graphene island to separate the third area from the fourth area after the sending of data from the second circuit to the first circuit.

The means for controlling the second graphene island to electrically interconnect the third and the fourth area may comprise means for controlling the second switch to connect to an electric potential and the means for controlling the second graphene island to separate the third area from the fourth area after the sending of data may comprise means for controlling the second switch to disconnect from the electric potential.

While the solution of this disclosure has been described in connection with what is presently considered to be most practical and preferred embodiments, it is to be understood that the solution is not to be limited to the disclosed embodiments, but on the contrary, is intended to cover various modifications and equivalent arrangements. Therefore, the solution is only to be limited by the following claims.

The invention claimed is:

1. A circuit board arrangement comprising a circuit board, the circuit board comprising at least two conductive material structures and a separating layer, where the two conductive material structures are placed on opposite sides of the separating layer, said separating layer comprising a first graphene island stretching between a first area of a first of the conductive material structures and a second area of a second of the conductive material structures, said first graphene island being controllable to electrically interconnect the two areas or separate the two areas from each other, wherein the first graphene island is a controllable via running through the separating layer.

2. The circuit board arrangement according to claim 1, further comprising a first switch configured to selectively connect the first graphene island to an electric potential in order to electrically interconnect the first area and the second area.

3. The circuit board arrangement according to claim 2, wherein the first switch is connected to the electric potential via a first impedance for regulating a degree of electrical interconnection between the first area and the second area.

4. The circuit board arrangement according to claim 1, further comprising a first circuit connected to the first area and a second circuit connected to the second area, the first circuit being configured to control the first graphene island to electrically interconnect the first area and the second area and to communicate with the second circuit after the electrical interconnection.

5. The circuit board arrangement according to claim 4, the first circuit being further configured to control the first graphene island to separate the first area from the second area after the communication.

6. The circuit board arrangement according to claim 4, wherein the communication comprises obtaining sensor measurements from the second circuit.

7. The circuit board arrangement according to claim 4, wherein the communication comprises sending data to the second circuit.

8. The circuit board arrangement according to claim 1, further comprising a second graphene island in the separating layer, the second graphene island stretching between a third area in the first conductive material structure and a fourth area in the second conductive material structure, the second graphene island being controllable to electrically interconnect the two areas or separate the two areas from each other.

9. The circuit board arrangement according to claim 8, further comprising a second switch configured to selectively connect the second graphene island to an electric potential in order to electrically interconnect the third area and the fourth area.

10. The circuit board arrangement according to claim 8, wherein the first circuit is connected to the third area and the second circuit is connected to the fourth area and configured to control the second graphene island to electrically interconnect the third area and the fourth area as well as to communicate with the first circuit after the electrical interconnection.

11. A wireless communication device comprising the circuit board arrangement according to claim 1.

12. The circuit board arrangement according to claim 4, wherein the communication comprises sending data to the second circuit.

13. The circuit board arrangement according to claim 12, further comprising a second graphene island in the separating layer, the second graphene island stretching between a third area in the first conductive material structure and a fourth area in the second conductive material structure, the second graphene island being controllable to electrically interconnect the two areas or separate the two areas from each other.

14. The circuit board arrangement according to claim 13, further comprising a second switch configured to selectively connect the second graphene island to an electric potential to electrically interconnect the third area and the fourth area.

* * * * *